United States Patent
Cox et al.

(10) Patent No.: US 6,782,027 B2
(45) Date of Patent: Aug. 24, 2004

(54) RESONANT REFLECTOR FOR USE WITH OPTOELECTRONIC DEVICES

(75) Inventors: James Allen Cox, New Brighton, MN (US); Robert A. Morgan, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 226 days.

(21) Appl. No.: 09/751,422

(22) Filed: Dec. 29, 2000

(65) Prior Publication Data

US 2003/0103542 A1 Jun. 5, 2003

(51) Int. Cl.[7] ................................................. H01S 5/00
(52) U.S. Cl. .................................. 372/50; 372/96
(58) Field of Search .......................... 372/43–50, 96

(56) References Cited

U.S. PATENT DOCUMENTS

| | | | | |
|---|---|---|---|---|
| 4,317,085 A | 2/1982 | Burnham et al. | ............. | 372/50 |
| 4,466,694 A | 8/1984 | MacDonald | ................. | 385/37 |
| 4,660,207 A | 4/1987 | Svilans | ........................ | 372/45 |

(List continued on next page.)

FOREIGN PATENT DOCUMENTS

| | | | | |
|---|---|---|---|---|
| DE | 4 240 706 A | 6/1994 | | |
| EP | 0 288 184 A | 10/1988 | | |
| EP | 0 776 076 A | 5/1997 | | |
| JP | 60-123084 A | 7/1985 | | |
| JP | 02-054981 A | 2/1990 | | |
| JP | 5-299779 | 11/1993 | | |
| WO | WO 98/57402 | * 12/1998 | ........... | H01S/3/085 |

OTHER PUBLICATIONS

PCT International Search Report on PCT/US 01/49089, the PCT counterpart of this U.S. patent application, dated Oct. 1, 2002.

Banwell et al., "VCSE Laser Transmitters for Parallel Data Links", *IEEE Journal of Quantum Electronics*, vol. 29, No. 2, Feb. 1993, pp. 635–644.

Catchmark et al., "High Temperature CW Operation of Vertical Cavity Top Surface–Emitting Lasers", CLEO 1993, p. 138, no month 1993.

Chemla et al., "Nonlinear Optical Properties of Semiconductor Quantum Wells", *Optical Nonlinearities and Instabilities in Semiconductors*, Academic Press, Inc., Copyright 1988, pp. 83–120, no month.

Choa et al., "High–Speed Modulation of Vertical–Cavity Surface–Emitting Lasers", *IEEE Photonics Technology Letter*, vol. 3, No. 8, Aug. 1991, pp. 697–699.

G. G. Ortiz, et al., "Monolithic Integration of In0.2 GA0.8As Vertical Cavity Surface–Emitting Lasers with Resonance–Enhanced Quantum Well Photodetectors", *Electronics Letters*, vol. 32, No. 13, Jun. 20, 1996, pp. 1205–1207.

(List continued on next page.)

*Primary Examiner*—Quyen Leung
(74) *Attorney, Agent, or Firm*—Workman Nydegger

(57) ABSTRACT

An optoelectronic device that provides isolation between a resonant reflector and an adjacent conducting layer of the optoelectronic device. Isolation may be accomplished by providing a buffer or cladding layer between the resonant reflector and the adjacent conducting layer of the optoelectronic device. The cladding or buffer layer is preferably sufficiently thick, or has a sufficiently low refractive index relative to the refractive index of the waveguide of the resonant reflector, to substantially prevent energy in the evanescent tail of the guided mode in the waveguide from entering the adjacent conductive layer of the optoelectronic device.

32 Claims, 13 Drawing Sheets

U.S. PATENT DOCUMENTS

| | | | |
|---|---|---|---|
| 4,784,722 A | 11/1988 | Liau et al. | 156/649 |
| 4,885,592 A | 12/1989 | Kofol et al. | 343/754 |
| 4,901,327 A | 2/1990 | Bradley | 372/45 |
| 4,904,045 A * | 2/1990 | Alferness et al. | 372/45 |
| 4,943,970 A | 7/1990 | Bradley | 372/45 |
| 4,956,844 A | 9/1990 | Goodhue et al. | 372/44 |
| 5,031,187 A | 7/1991 | Orenstein et al. | 372/50 |
| 5,052,016 A | 9/1991 | Mahbobzadeh | 372/96 |
| 5,056,098 A | 10/1991 | Anthony et al. | 372/45 |
| 5,062,115 A | 10/1991 | Thornton | 372/50 |
| 5,068,869 A | 11/1991 | Wang et al. | 372/45 |
| 5,115,442 A | 5/1992 | Lee et al. | 372/45 |
| 5,140,605 A | 8/1992 | Paoli et al. | 372/50 |
| 5,158,908 A | 10/1992 | Blonder et al. | 438/32 |
| 5,216,263 A | 6/1993 | Paoli | 257/88 |
| 5,216,680 A | 6/1993 | Magnusson et al. | 372/20 |
| 5,237,581 A | 8/1993 | Asada et al. | 372/45 |
| 5,245,622 A | 9/1993 | Jewell et al. | 372/45 |
| 5,258,990 A | 11/1993 | Olbright et al. | 372/46 |
| 5,285,466 A | 2/1994 | Tabatabaie | 372/92 |
| 5,293,392 A | 3/1994 | Shieh et al. | 372/45 |
| 5,317,170 A | 5/1994 | Paoli | 257/88 |
| 5,317,587 A | 5/1994 | Ackley et al. | 372/45 |
| 5,325,386 A | 6/1994 | Jewell et al. | 372/50 |
| 5,331,654 A | 7/1994 | Jewell et al. | 372/45 |
| 5,337,074 A | 8/1994 | Thornton | 347/237 |
| 5,349,599 A | 9/1994 | Larkins | 372/50 |
| 5,351,256 A | 9/1994 | Schneider et al. | 372/45 |
| 5,359,447 A | 10/1994 | Hahn et al. | 359/154 |
| 5,359,618 A | 10/1994 | Lebby et al. | 372/45 |
| 5,363,397 A | 11/1994 | Collins et al. | 372/92 |
| 5,373,520 A | 12/1994 | Shoji et al. | 372/45 |
| 5,404,373 A | 4/1995 | Cheng | 372/50 |
| 5,416,044 A | 5/1995 | Chino et al. | 438/39 |
| 5,428,634 A | 6/1995 | Bryan et al. | 372/45 |
| 5,446,754 A | 8/1995 | Jewell et al. | 372/50 |
| 5,475,701 A | 12/1995 | Hibbs-Brenner | 372/50 |
| 5,513,202 A | 4/1996 | Kobayashi et al. | 372/96 |
| 5,530,715 A | 6/1996 | Shieh et al. | 372/96 |
| 5,555,255 A | 9/1996 | Kock et al. | 372/96 |
| 5,557,626 A | 9/1996 | Grodinski et al. | 372/45 |
| 5,561,683 A | 10/1996 | Kwon | 372/96 |
| 5,568,499 A | 10/1996 | Lear | 372/45 |
| 5,598,300 A | 1/1997 | Magnusson et al. | 359/566 |
| 5,606,572 A | 2/1997 | Swirhun et al. | 372/96 |
| 5,642,376 A | 6/1997 | Olbright et al. | 372/45 |
| 5,673,284 A * | 9/1997 | Congdon et al. | 372/50 |
| 5,727,013 A | 3/1998 | Botez et al. | 372/96 |
| 5,774,487 A | 6/1998 | Morgan | 372/45 |
| 5,778,018 A | 7/1998 | Yoshikawa et al. | 372/45 |
| 5,818,066 A | 10/1998 | Duboz | 257/21 |
| 5,835,521 A * | 11/1998 | Ramdani | 372/96 |
| 5,903,590 A | 5/1999 | Hadley et al. | 372/96 |
| 5,940,422 A | 8/1999 | Johnson | 372/45 |
| 5,978,401 A | 11/1999 | Morgan | 372/50 |
| 6,055,262 A | 4/2000 | Cox et al. | 372/96 |

OTHER PUBLICATIONS

Graf, Rudolph, *Modern Dictionary of Electronics*, 6th ed., Indiana: Howard W. Sams & Company, 1984, p. 694, no month.

Jewell et al., "Surface Emitting Microlasers for Photonic Switching & Intership Connections", *Optical Engineering*, vol. 29, No. 3, pp. 210–214, Mar. 1990.

Jewell et al., "Surface–Emitting Microlasers for Photonic Switching and Interchip Connections", *Optical Engineering*, vol. 29, No. 3, Mar. 1990, pp. 210–214.

Kishino et al., "Resonant Cavity–Enhanced (RCE) Photo-detectors", *IEEE Journal of Quantum Electronics*, vol. 27, No. 8, pp. 2025–2034, Aug. 1991.

Kuchibhotla et al., "Low–Voltage High Gain Resonant Cavity Avalanche Photodiode", *IEEE Phototonics Technology Letters*, vol. 3, No. 4, pp. 354–356, Apr. 1991.

Lai et al., "Design of a Tunable GaAs/AlGaAs Multiple–Quantum–Well Resonant Cavity Photodetector", *IEEE Journal of Quantum Electronics*, vol. 30, No. 1, pp. 108–114, Jan. 1994.

Lee et al., "Top–Surface Emitting GaAs Four–Quantum–Well Lasers Emitting at 0–85 um", *Electronics Letters*, vol. 24, No. 11, May 24, 1990, pp. 710–711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Miller et al., "Optical Bistability Due to Increasing Absorption", *Optics Letters*, vol. 9, No. 5, May 1984, pp. 162–164.

Morgan et al., "200 C, 96–nm Wavelength Range, Continuous–Wave Lasing from Unbonded GaAs MOVPE–Grown Vertical Cavity Surface–Emitting Lasers", *IEEE Photonics Technology Letters*, vol. 7, No. 5, May 1995, pp. 441–443.

Jiang et al., "High–Frequency Polarization Self–Modulation in Vertical–Cavity Surface–Emitting Lasers", *Appl. Phys. Letters*, vol. 63, No. 26, Dec. 27, 1993, pp. 2545–2547.

Morgan et al., "High–Power Coherently Coupled 8x8 Vertical Cavity Surface Emitting Laser Array", *Appl. Phys Letters*, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", *Appl. Phys. Letters*, vol. 66, No. 10, Mar. 6, 1995, pp. 1157–1159.

Morgan et al., "Novel Hybrid–DBR Single–Mode Controlled GaAs Top–Emitting VCSEL with Record Low Voltage", 2 pages, dated prior to Dec. 29, 2000.

Morgan et al., "Progress and Properties of High–Power Coherent Vertical Cavity Surface Emitting Laser Arrays", *SPIE*, Vo. 1850, Jan. 1993, pp. 100–108.

Morgan et al., "Progress in Planarized Vertical Cavity Surface Emitting Laser Devices and Arrays", *SPIE*, vol. 1562, Jul. 1991, pp. 149–159.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", *IEEE Photonics Technology Letters*, vol. 4, No. 4, Apr. 1993, pp. 374–377.

Morgan et al., "Vertical Cavity Surface Emitting Laser Arrays: Come of Age,", Invited paper, *SPIE*, vol. 2683–04, OE LASE 96; Photonics West: Frabrication, Testing and Reliability of Semiconductor Lasers, (SPIE< Bellingham, WA, 1996), no month.

Morgan et al., "Vertical–Cavity Surface–Emitting Laser Arrays" *SPIE*, vol. 2398, Feb. 1995, pp. 65–93.

Morgan, "High–Performance, Producible Vertical Cavity Lasers for Optical Interconnects", *High Speed Electronics and Systems*, vol. 5, No. 4, Dec. 1994, pp. 65–95.

Morgan, "Transverse Mode Control of Vertical–Cavity Top–Surface Emitting Lasers", *IEEE Phot. Tech. Lett.*, vol. 4, No. 4., p. 374, Apr. 1993.

Nugent et al., "Self–Pulsations in Vertical–Cavity Surface–Emitting Lasers", *Electronic Letters*, vol. 31, No. 1, Jan. 5, 1995, pp. 43–44.

U.S. patent application Ser. No. 09/751,423, filed Dec. 29, 2000, entitled "Spatially Modulated Reflector for an Optoelectronic Device".

Guenter et al., "Reliability of Proton–Implanted VCSELs for Data Communications", Invited paper, *SPIE,* vol. 2683, OE LASE 96; Photonics West: Fabrication, Testing and Reliability of Semiconductor Lasers, (SPIE, Bellingham, WA 1996), no month.

Hibbs–Brenner et al., "Performance, Uniformity and Yield of 850nm VCSELs Deposited by MOVPE", *IEEE Phot. Tech. Lett.,* vol. 8, No. 1, pp. 7–9, Jan. 1996.

Hornak et al., "Low–Termperature (10K–300K) Characterization of MOVPE–Grown Vertical–Cavity Surface–Emitting Lasers", *Photon. Tech. Lett.,* vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", *Appl. Phys. Lett.,* vol. 66, No. 14, pp. 1723–1725, Apr. 3, 1995.

K.L. Lear et al., "Selectively Oxidized Vertical Cavity Surface–Emitting Lasers with 50% Power Conversion Efficiency", *Elec. Lett.,* vol. 31, No. 3 pp. 208–209, Feb. 2, 1995.

Lehman et al., "High Frequency Modulation Characteristics of Hybrid Dielectric/AlGaAs Mirror Singlemode VCSELs", *Electronic Letters,* vol. 31, No. 15, Jul. 20, 1995, pp. 1251–1252.

Magnusson, "Integration of Guided–Mode Resonance Filters and VCSELs", Electo–Optics Research Center, Department of Electrical Engineering, University of Texas at Arlington, May 6, 1997.

Morgan et al., "Hybrid Dielectric/AlGaAs Mirror Spatially–Filtered Vertical Top–Surface Emitting Laser", *Appl. Phys. Lett.,* vol. 60, No. 8, pp. 921–923, Feb. 24, 1992.

Morgan et al., "One Watt Vertical Cavity Surface Emitting Laser", *Electron. Lett.,* vol. 29, No. 2, pp. 206–207, Jan. 21, 1993.

Morgan et al., "Producible GaAs–based MOVPE–Grown Vertical–Cavity Top–Surface Emitting Lasers with Record Performance", *Elec. Lett.,* vol. 31, No. 6, pp. 462–464, Mar. 16, 1995.

Morgan et al., "Spatial–Filtered Vertical–Cavity Top Surface–Emitting Lasers", CLEO, 1993, pp. 138–139, no month.

Morgan et al., "Vertical Cavity Surface Emitting Laser Arrays: Come of Age," , Invited paper, *SPIE,* vol. 2683–04, OE LASE 96; Photonics West: Frabrication, Testing and Reliablity of Semiconductor Lasers, (SPIE< Bellingham, WA, 1996), no month.

S.S. Wang and R. Magnusson, "Multilayer Waveguide–Grating Filters", *Appl. Opt.,* vol. 34, No. 14, pp. 2414–2420, 1995, no month.

S.S. Wang and R. Magnusson, "Theory and Applications of Guided–Mode Resonance Filters", *Appl. Opt.,* vol. 32, No. 14, pp. 2606–2613, 1993, no month.

Schubert, "Resonant Cavity Light–Emitting Diode", *Appl. Phys. Lett.,* vol. 60, No. 8, pp. 921–923, Feb. 24, 1992.

Y. M. Yang et al., "Ultralow Threshold Current Vertical Cavity Surface Emitting Lasers Obtained with Selective Oxidation", *Elect. Lett.,* vol. 31, No. 11, pp. 886–888, May 25, 1995.

Yablonovitch et al., "Photonic Bandgap Structures", *J. Opt. Soc. Am. B.,* vol. 10, No. 2, pp. 283–295, Feb. 1993.

Young et al., "Enhanced Performance of Offset–Gain High Barrier Vertical–Cavity Surface–Emitting Lasers", *IEEE J. Quantum Electron.,* vol. 29, No. 6, pp. 2013–2022, Jun. 1993.

Smith, R.E. et al., Polarization–Sensitive Subwavelength Antireflection Surfaces on a Semiconductor for 975 NM, *Optics Letters,* vol. 21, No. 15, Aug. 1, 1996, pp. 1201–1203.

Suning Tang et al., "Design Limitations of Highly Parallel Free–Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

Cox, J. A., et al., "Guided Mode Grating Resonant Filters for VCSEL Applications", *Proceedings of the SPIE,* The International Society for Optical Engineering, Diffractive and Holographic Device Technologies and Applications V, San Jose, California, Jan. 28–29, 1998, vol. 3291, pp. 70–71.

Martinsson et al., "Transverse Mode Selection in Large–Area Oxide–Confined Vertical–Cavity Surface–Emitting Lasers Using a Shallow Surface Relief", *IEEE Photon. Technol. Lett.,* 11(12), 1536–1538, Dec. 1999.

Choquette et al., "Lithographically–Defined Gain Apertures Within Selectively Oxidized VCSELs", paper CtuL6, Conference on Lasers and Electro–Optics, San Francisco, California, May 2000.

Oh, T. H. et al., "Single–Mode Operation in Antiguided Vertical–Cavity Surface–Emitting Laser Using a Low–Temperature Grown AlGaAs Dielectric Aperture", *IEEE Photon. Technol. Lett,* 10(8), 1064–1066 (1998), no month.

"Surface–Emitting Microlasers for Photonic Switching and Interchip Connections", *Optical Engineering,* 29, pp. 210–214, Mar. 1990.

G. Shtengel et al., "High–Speed Vertical–Cavity Surface–Emitting Lasers", *Photon. Tech. Lett.,* vol. 5, No. 12, pp. 1359–1361 (Dec. 1993).

* cited by examiner

RESONANT REFLECTOR FOR USE WITH OPTOELECTRONIC DEVICES

BACKGROUND OF THE INVENTION

This invention relates to the field of optoelectronic devices, and more particularly to resonant reflectors for use with optoelectronic devices.

Various forms of optoelectronic devices have been developed and have found widespread use including, for example, semiconductor photodiodes, semiconductor photo detectors, etc. Semiconductor lasers have found widespread use in modem technology as the light source of choice for various devices, e.g., communication systems, compact disc players, and so on. For many of these applications, a semiconductor laser is coupled to a semiconductor detector (e.g., photodiode) through a fiber optic link or even free space. This configuration provides a high-speed communication path, which, for many applications, can be extremely beneficial.

A typical edge-emitting semiconductor laser is a double heterostructure with a narrow bandgap, high refractive index layer surrounded on opposed major surfaces by wide bandgap, low refractive index layers often called cladding layers. The low bandgap layer is termed the "active layer", and the cladding layers serve to confine both charge carriers and optical energy in the active layer or region. Opposite ends of the active layer have mirror facets which form the laser cavity. When current is passed through the structure, electrons and holes combine in the active layer to generate light.

Another type of semiconductor laser is a surface emitting laser. Several types of surface emitting lasers have been developed including Vertical Cavity Surface Emitting Lasers (VCSEL). (See, for example, "Surface-emitting microlasers for photonic switching and interchip connections", *Optical Engineering*, 29, pp.210–214, March 1990, for a description of this laser). For other examples, note U.S. Pat. No. 5,115,442, by Yong H. Lee et al., issued May 19, 1992, and entitled "Top-emitting Surface Emitting Laser Structures", which is hereby incorporated by reference, and U.S. Pat. No. 5,475,701, issued on Dec. 12, 1995 to Mary K. Hibbs-Brenner, and entitled "Integrated Laser Power Monitor", which is hereby incorporated by reference. Also, see "Top-surface-emitting GaAs four-quantum-well lasers emitting at 0.85 $\mu$m", *Electronics Letters*, 26, pp. 710–711, May 24, 1990.)

Vertical Cavity Surface Emitting Lasers offer numerous performance and potential producibility advantages over conventional edge emitting lasers. These include many benefits associated with their geometry, including their amenability to one- and two-dimensional arrays, wafer-level qualification, and desirable beam characteristics, typically circularly symmetric low-divergence beams.

VCSELs typically have an active region having bulk or one or more quantum well layers. On opposite sides of the active region are mirror stacks, often formed by interleaved semiconductor layers each a quarter wavelength thick at the desired operating wavelength (in the medium). The mirror stacks are typically of opposite conductivity type on either side of the active region, and the laser is typically turned on and off by varying the current through the mirror stacks and the active region.

High-yield, high performance VCSELs have been demonstrated and exploited in commercialization. Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields. VCSELs are expected to provide a performance and cost advantage in fast (e.g., Gbits/s) medium distance (e.g., up to approximately 1000 meters) single or multi-channel data link applications, and numerous optical and/or imaging applications. This results from their inherent geometry, which provides potential low-cost high performance transmitters with flexible and desirable characteristics.

A related photodetector is known as a resonant cavity photo detector (RCPD). Resonant cavity photodetectors are typically constructed similar to VCSELs, but operate in a reverse bias mode. A resonant cavity photodetector may be more efficient than a standard photodiode because the light that enters the optical cavity, through one of the mirrors, may be effectively reflected through the active region many times. The light may thus be reflected between the mirror stacks until the light is either absorbed by the active region or until it escapes through one of the mirror stacks. Because the mirror stacks are typically highly reflective near resonance, most of the light that enters the cavity is absorbed by the active region.

For many optoelectronic devices that have a resonant cavity, the top and/or bottom mirror stacks are Distributed Bragg Reflector (DBR) mirrors. DBR mirrors AlGaAs and AlAs. Often, both the top and bottom mirror stacks include a significant number of DBR mirror periods to achieve the desired reflectance. One way to reduce the number of DBR mirror periods that are required is to replace some of the DBR mirror periods with a resonant reflector. Such a configuration is disclosed in U.S. Pat. No. 6,055,262, entitled "Resonant Reflector For Improved Optoelectronic Device Performance And Enhanced Applicability", which is incorporated herein by reference. A typical resonant reflector may include, among other things, a waveguide and a grating.

Despite the advantages of using a resonant reflector in conjunction with a DBR mirror stack, it has been found that the reflectivity of the resonant reflector can be limited if it is not properly isolated from adjacent conductive layers. Too much energy in the guided-mode in the waveguide overlaps into the lossy, conductive DBR films of the optoelectronic device. What would be desirable, therefore, is an optoelectronic device that provides isolation between the resonant reflector and adjacent conducting layers of the optoelectronic device.

SUMMARY OF THE INVENTION

The present invention overcomes many of the disadvantages of the prior art by providing an optoelectronic device that provides isolation between a resonant reflector and an adjacent conducting layer of the optoelectronic device. Isolation is preferably accomplished by providing a dielectric buffer or cladding layer between the resonant reflector and the adjacent conducting layer of the optoelectronic device. The cladding or buffer layer is preferably sufficiently thick, and/or has a sufficiently low refractive index relative to the refractive index of the waveguide of the resonant reflector, to substantially prevent energy in the evanescent tail of the guided mode in the waveguide from entering the adjacent conductive layer of the optoelectronic device.

In one illustrative embodiment of the present invention, an optoelectronic device includes a top mirror and a bottom mirror, with an active region situated therebetween. The top mirror and bottom mirror are Distributed Bragg Reflector (DBR) mirrors made from alternating layers of semiconductor materials that are doped to be at least partially conductive. Current can be provided through the active region and DBR mirrors to activate the device.

A resonant reflector is positioned adjacent a selected one of the top or bottom mirrors of the optoelectronic device. The resonant reflector preferably has a waveguide and a grating. The waveguide and grating are preferably configured such that a first-diffraction order wave vector of the grating substantially matches the propagating mode of the waveguide. A cladding or buffer layer is positioned between the resonant reflector and the selected top or bottom mirror. The cladding or buffer layer is preferably sufficiently thick, and/or has a sufficiently low refractive index relative to the refractive index of the waveguide, to substantially prevent energy in the evanescent tail of the guided mode in the waveguide from entering the selected top or bottom mirror.

An illustrative method for forming such an optoelectronic device includes providing a bottom mirror on a substrate. The bottom mirror is preferably a DBR mirror stack, and is doped to be at least partially conductive. An active region is then formed on the bottom mirror, followed by a top mirror. Like the bottom mirror, the top mirror is preferably a DBR mirror stack, and is doped to be the opposite conductivity type of the bottom mirror. If desired, the active region may include cladding layers on either side to help focus the light and current in the active region. Next, a deep H+ ion implant may be provided to provide a gain guide aperture, as is known in the art. While a deep H+ implant is provided as an illustration, it is contemplated that any type of current and field confinement may be used, including for example, gain-guided, oxide-confinement, or any other means. Finally, contacts may be provided on the top mirror and on the bottom surface of the substrate to provide electrical contact to the optoelectronic device.

Next, a cladding or buffer layer is provided above the top mirror. A resonant reflector is then provided adjacent the cladding or buffer layer. The resonant reflector preferably includes a waveguide and a grating which are configured such that a first-diffraction order wave vector of the grating substantially matches a propagating mode of the waveguide. To isolate the resonant reflector from the optoelectronic device, and in particular the conductive top mirror, the cladding or buffer layer is preferably sufficiently thick to substantially prevent energy in the evanescent tail of the guided mode in the waveguide from entering the top mirror. Alternatively, or in addition, the cladding or buffer layer may be formed from a material that has a sufficiently low refractive index relative to the refractive index of the waveguide to substantially prevent energy in the evanescent tail of the guided mode in the waveguide from entering the top mirror. The cladding or buffer layer is preferably non-conductive.

In another illustrative method, a resonant reflector is formed on a first substrate, and at least part of an optoelectronic device is formed on a second substrate. The first substrate is then bonded to the second substrate to complete the device. More specifically, a first substrate having a front side and a backside is provided. A resonant reflector is formed on the front side of the second substrate. Then, a second substrate having a front side and a backside is provided. At least part of an optoelectronic device is formed on the front side of the second substrate. The optoelectronic device may include, for example, a bottom mirror, an active region and a top mirror, as discussed above. Thereafter, the front side of the first substrate is bonded to the front side of the second substrate to complete the optoelectronic device.

The first substrate may be bonded to the second substrate using an optical epoxy that is sufficiently thick, and/or has a sufficiently low refractive index relative to the refractive index of the waveguide of the resonant reflector, so that energy from the evanescent wave vector is substantially prevented from entering the optoelectronic device on the first substrate. For top emitting devices, a collimating microlens may be provided on the backside of the first substrate. For back emitting devices, a collimating microlens may be provided on the backside of the second substrate. In either case, the collimating microlens is preferably in registration with the output of the optoelectronic device.

The present invention also contemplates forming a number of optoelectronic devices on a common substrate. One application for such a configuration is a monolithic transceiver that includes one or more light emitting devices and one or more light receiving devices. Both the light emitting and light receiving devices are preferably formed on a common substrate. In one example, a bottom mirror is first formed on the common substrate. The bottom mirror may serve as the bottom mirror for more than one of the optoelectronic devices, and is preferably a DBR mirror stack that is doped to be at least partially conductive. An active region is then formed on the bottom mirror, followed by a top mirror. Like the bottom mirror, the top mirror is preferably a DBR mirror stack, and is doped to be the opposite conductivity type of the bottom mirror. Contacts may be provided on the top mirror and on the bottom surface of the substrate to provide electrical contact to each of the optoelectronic devices.

Next, a cladding or buffer layer may be provided above the top mirror. A resonant reflector may then be provided on the cladding or buffer layer. The resonant reflector may include a waveguide and a grating film. For some optoelectronic devices, such as top emitting devices, the grating film may be etched to form a grating. This may substantially increase the reflectivity of the resonant reflector in those regions. For other optoelectronic devices, such as top receiving devices, the grating film may be etched to include a different grating structure (e.g., wider spectral bandwidth) or remain non-etched which reduces the reflectivity of the resonant reflector thereby allowing light to more easily enter the optical cavity. For yet other optoelectronic devices, such as Metal-Semiconductor-Metal (MSM) receiving devices, the grating film may be removed altogether, and a metal grid may be provided on the cladding or buffer layer.

In another illustrative embodiment of the present invention, an improved resonant reflector and method of making the same is provided. In this embodiment, a waveguide and a grating film are both provided. The grating film is etched to form two or more spaced grating regions separated by one or more spaced etched regions. Rather than varying the fill factor of the grating to achieve the desired optical properties of the resonant reflector, this embodiment contemplates controlling the etch depth of the spaced etched regions. It has been found that this may increase the producibility and yield of the resonant reflector.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
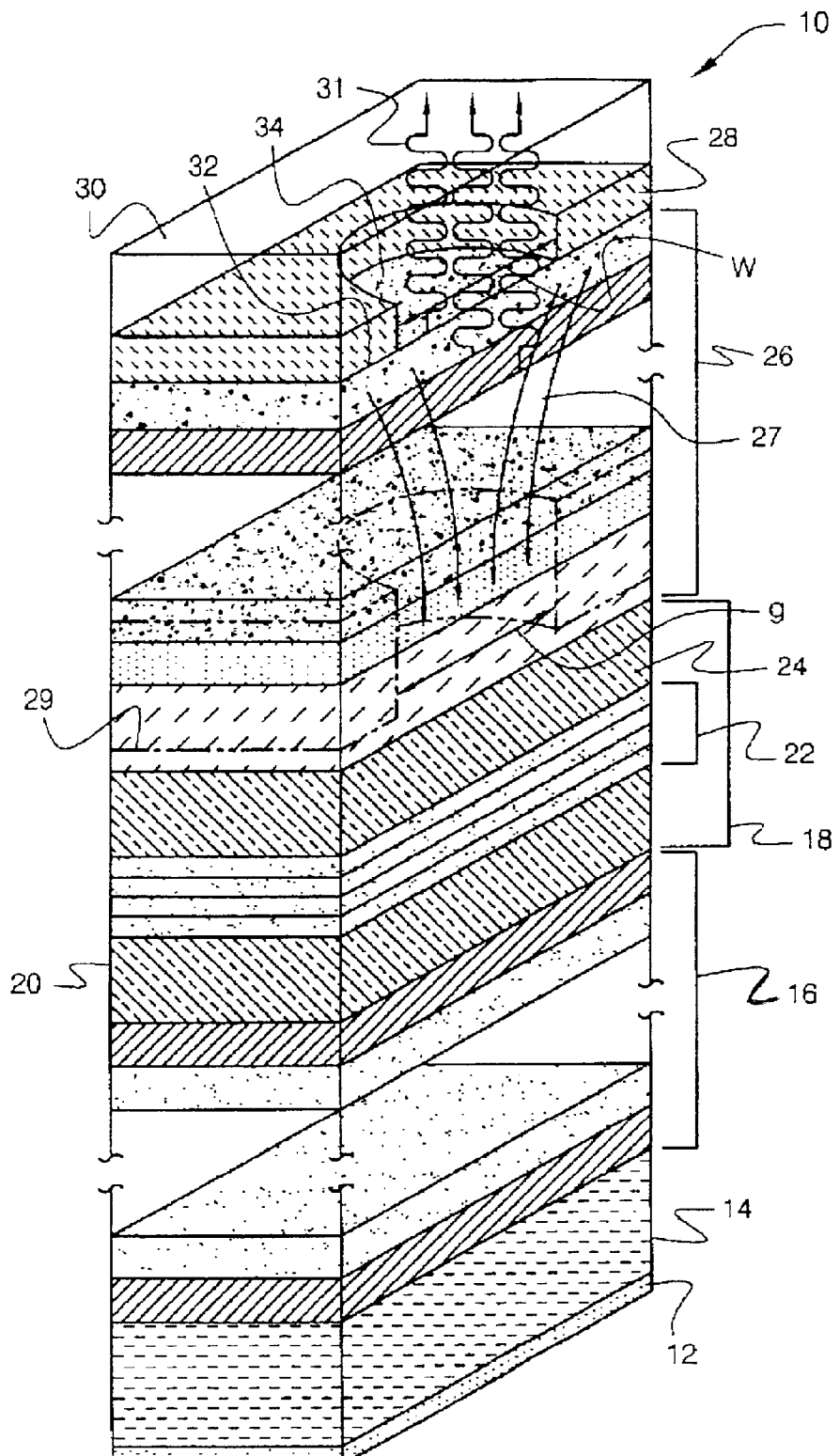
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is a n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. While a deep H+ implant is provided as an illustration, it is contemplated that any type of current and field confinement may be used, including for example, gain-guided, oxide-confinement, or any other means. The diameter "g" may be set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g., $\lambda$=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

A typical near IR VCSEL requires high reflectivity (>99%). Thus, an all-semiconductor DBR typically requires 20–40 mirror periods with a thickness of 2–4 μm. As such, the epi-structure required for a complete VCSEL, including both top and bottom DBR mirrors surrounding an active spacer region typically includes over 200 layers having a thickness in excess of 7–8 μm.

Figure 2:
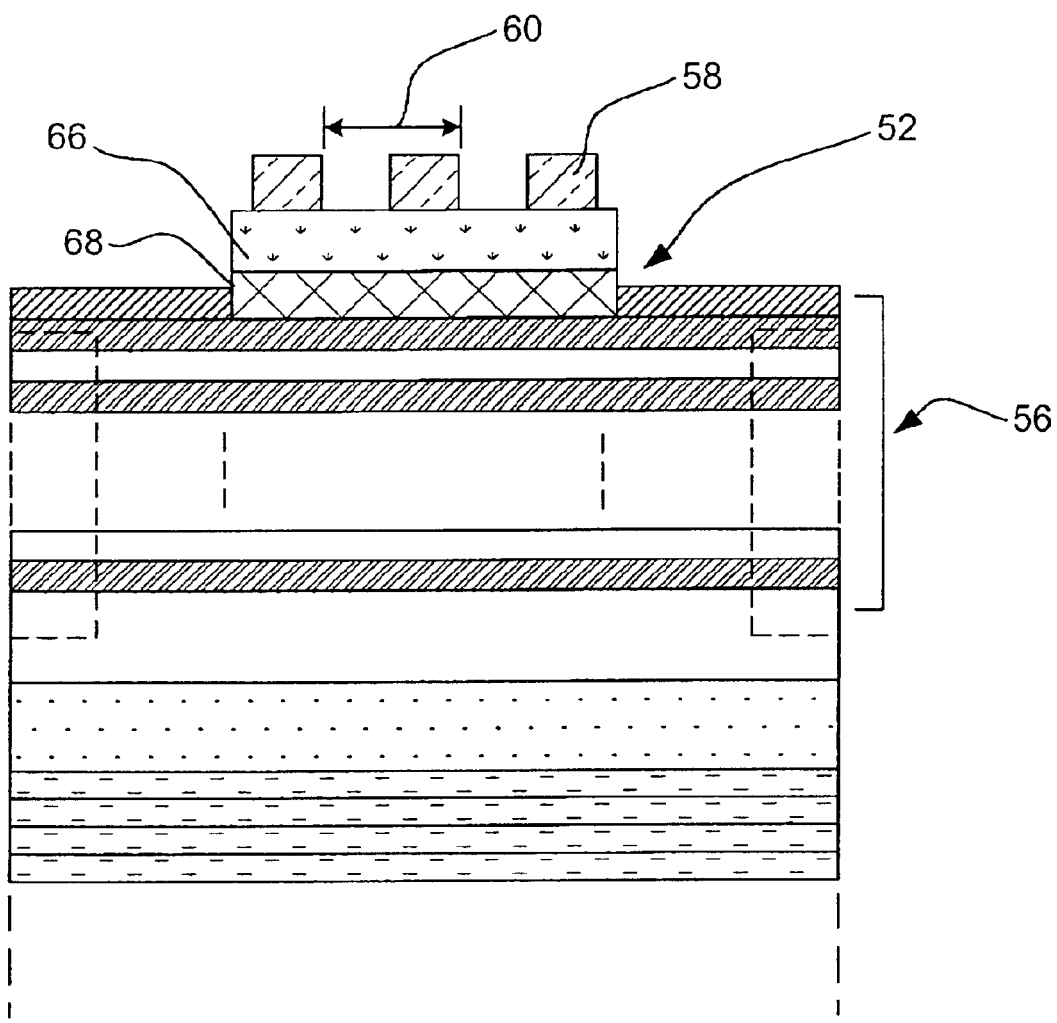
FIG. 2 is a schematic cross-sectional side view of a planar, current-guided, GaAs/AlGaAs top surface emitting vertical cavity laser with an illustrative resonant reflector.

As discussed in U.S. Pat. No. 6,055,262, entitled "Resonant Reflector For Improved Optoelectronic Device Performance And Enhanced Applicability", a hybrid mirror structure may be used to reduce the overall mirror thickness. FIG. 2 is a schematic cross-sectional side view of a planar, current-guided, GaAs/AlGaAs top surface emitting vertical cavity laser with a hybrid top mirror including a resonant reflector 52 and a distributed Bragg reflector 56. This device combines the anomalous filtering properties of guided mode resonance in a dielectric waveguide grating with the reflective properties of a conventional DBR mirror.

The hybrid mirror structure includes, for example, a resonant reflector 52 and a DBR mirror 56. Although not explicitly shown, it is contemplated that the bottom mirror may also include a resonant reflector structure, if desired. It is known that a dielectric resonant reflector 52 is highly reflective on resonance, and may be more reflective than a corresponding DBR type mirror at the same wavelength. Thus, by using a hybrid approach, it is contemplated that the number of DBR mirror periods needed for a given reflectance may be reduced.

It is known that lateral straggle effects during ion implantation of the gain guiding region 62 through the DBR mirrors often limits the lateral dimension 64 of the active region to ≧10 μm. This directly impacts the minimum achievable threshold current, single mode operation, and indirectly impacts the speed of the VCSEL. By incorporating a resonant reflector into the top mirror, equivalent or superior reflectance properties in a structure five to ten times thinner may be achieved. This may translate into an ion implant that is more controllable, which may reduce the volume of the active region. A smaller active region may reduce the operating current and power of the device, improve planarity and thus the monolithic integribility of the VCSEL with electronics and smart pixels, and may provide a controllable single mode and single polarization emission with increased modal control.

It is recognized that the hybrid approach of FIG. 2 is compatible with alternate existing gain-guiding techniques including etched pillars (with or without planarization and/ or regrowth), lateral oxidation, selective growth, etc. By decreasing the overall thickness of the VCSEL mirrors, the resonant reflector may improve the processiblility and performance of the alternate current guiding approaches. While ion implantation is provided as an illustration, it is contemplated that any type of current and field confinement may be used, including for example, gain-guided, oxide-confinement, or any other means.

The resonant reflector 52 of FIG. 2 includes a three layer waveguide-grating structure suitable for use in a near IR VCSEL. The three-layer stack may be designed to function both as an anti-reflection (AR) coating near the emission wavelength for the VCSEL-structure substrate and independently as a guided-mode resonant reflector waveguide-grating. The three layers of resonant reflector 52 may form an anti-reflective region, which provides little reflectance for at least a predetermined range of wavelengths including a resonant wavelength. The grating multilayer waveguide structure shown at 52 causes the structure to become substantially more reflective, at least at the resonant wavelength.

Alternatively, the three-layer stack 52 may be designed to function both as a high-reflectivity coating for the VCSEL-structure substrate and independently as a guided-mode resonant reflector waveguide-grating. In this embodiment, the three-layer structure 52 forms a highly-reflective mirror region which provides reflectance for at least a predetermined range of wavelengths including a resonant wavelength (e.g., near 980 nm). The overall reflectance of the top mirror, including layers 66 and 68, may be less than that required for lasing. This may be accomplished by, for example, reducing the number of mirror periods in the top DBR mirror 56. Grating layer 58 causes the guided mode resonant reflector structure 52 to become substantially more reflective at least near the resonant wavelength. In either case, the number of DBR mirror layers beneath the resonant reflector 52 may be reduced relative to the conventional VCSEL construction shown in FIG. 1.

Resonance is achieved in the resonance reflector 52 by matching the first-diffraction order wave vector of the grating 58 to the propagating mode of the waveguide 66. Since the latter depends on polarization, the reflectance is inherently polarization-selective. The resonant wavelength is determined primarily by the grating period 60, and the bandwidth is determined primarily by the modulation of the refractive index and fill factor of the grating 58.

Figure 3:
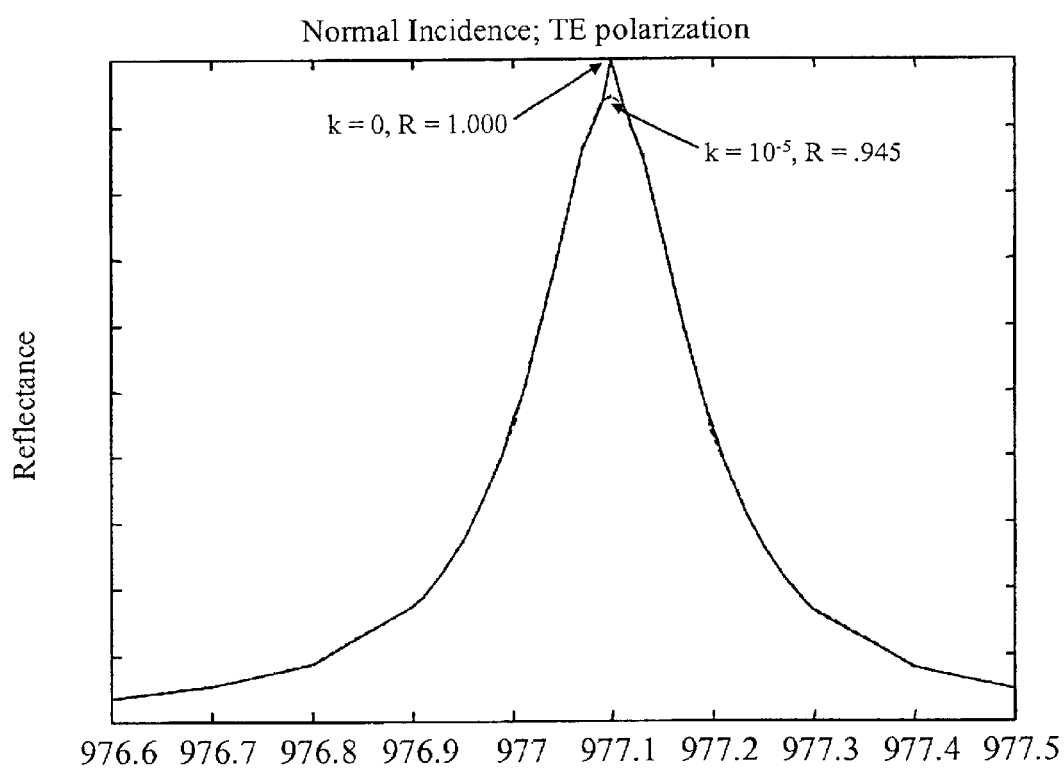
FIG. 3 is a graph showing the reflectivity versus wavelength of the resonant reflector of FIG. 2, both with a non-conductive (k=0) waveguide layer and a slightly conductive ($k=10^{-5}$) waveguide layer.

FIG. 3 is a graph showing reflectance curves for a resonant reflector assuming two values for the imaginary component of the refractive index (k=0 and $10^{-5}$) in any one layer of the waveguide-grating structure, and k=0 in the other two layers. In this example, the top layer, middle layer and bottom layer are formed from IndiumTinOxide (ITO), GaAs, and AlGaAs, respectively. The refraction indices for the top, middle and bottom layers are 1.96, 3.5 and 3.24, respectively, and the thicknesses of the top, middle and bottom layers are preferably $\lambda/4$, $3\lambda/4$ and $\lambda/4$, respectively. For this measurement, the layers are placed on a substrate with an effective reflective index of 3.2. This structure is simulated to exhibit one transverse Electric (TE) mode resonance (with a polarization parallel to the grating), no perpendicular resonance and a low out of resonant reflectance near $10^{-6}$.

The imaginary component "k" of the refractive index is related to optical absorption and electrical conductivity of the resonant reflector. The case k=$10^{-5}$, which roughly corresponds to the minimum conductivity required to inject current through the resonant reflector, produces about 5 percent absorption. The same three layers, all with k=0, indicating a dielectric resonant reflector, produces theoretically 100 percent reflectance.

This graph illustrates the extreme sensitivity of the resonant reflector 52 to absorption, or more generally, to loss of any kind. Thus, to maximize the reflectance provided by the resonant reflector, the absorption (e.g. k=0) for each of the layers 58, 66 and 68 should be near zero. This means that the conductivity of the resonant reflector should also be zero (e.g., non-conductive).

Figure 4:
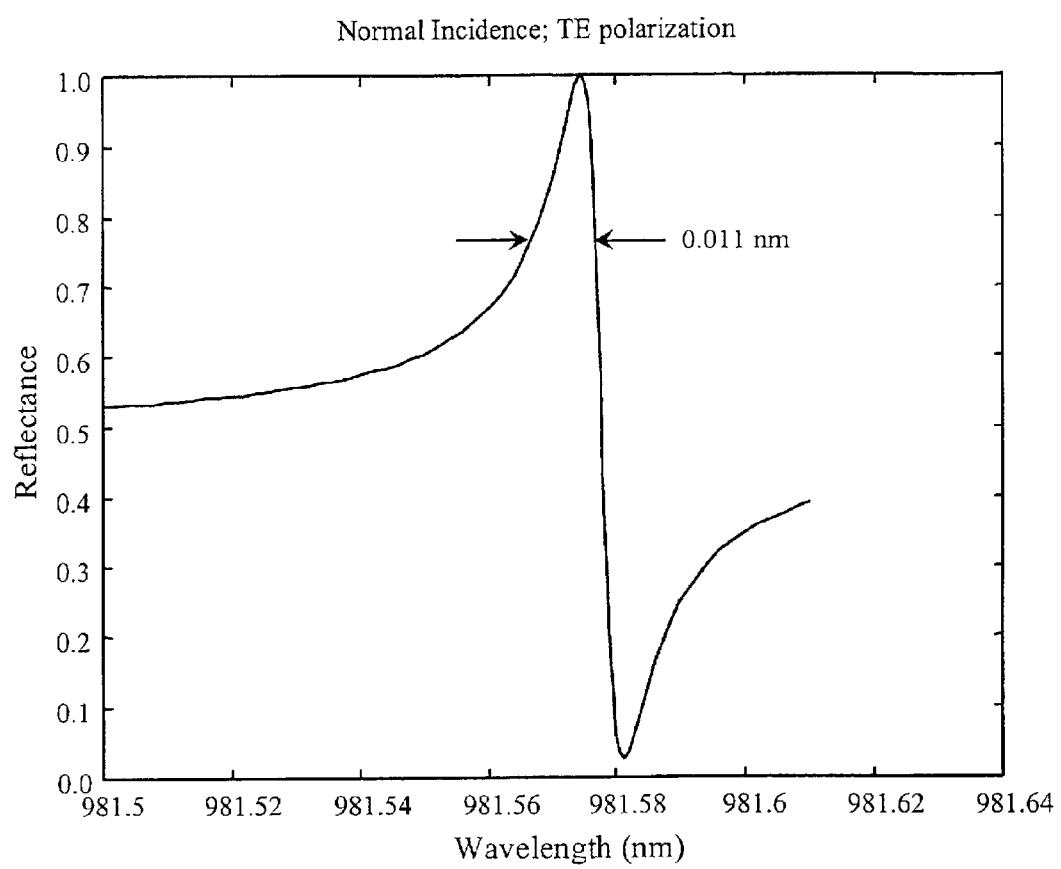
FIG. 4 is a graph showing the reflectance versus wavelength of an all non-conductive (k=0) resonant reflector placed adjacent a top mirror that is also non-conductive (k=0)
Figure 5:
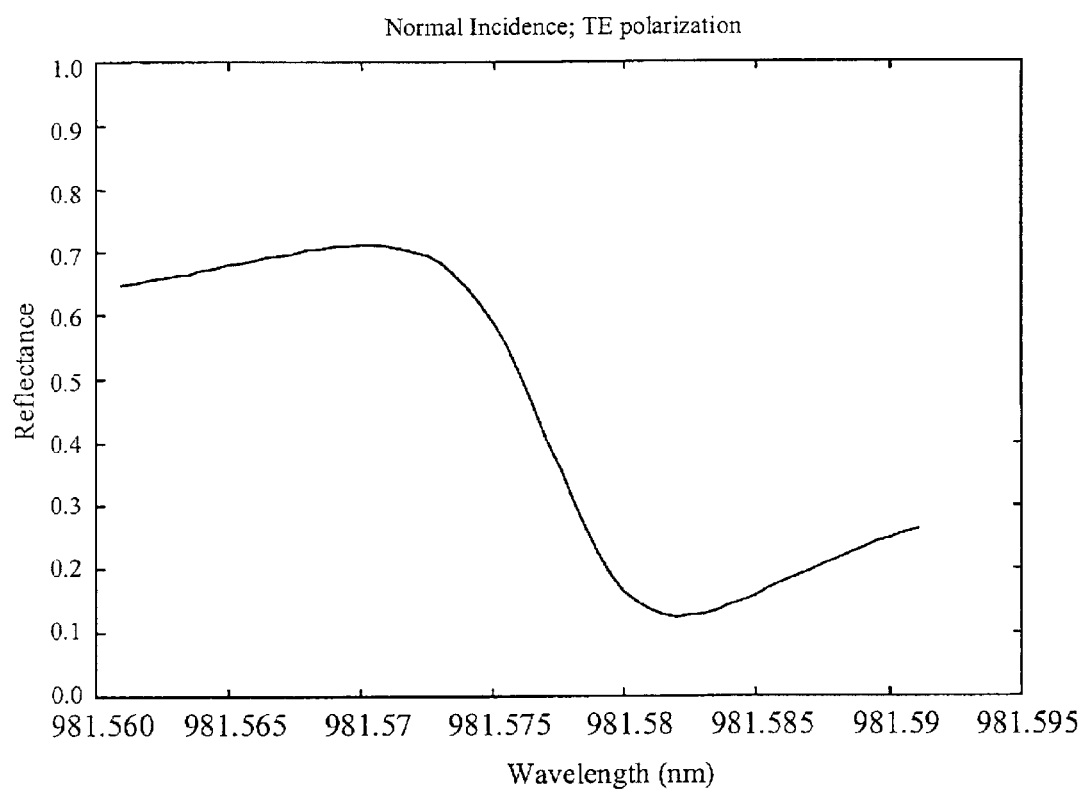
FIG. 5 shows the reflectance versus wavelength of an all non-conductive resonant reflector placed adjacent a top mirror that is slightly conductive ($k=10^{-5}$)

Despite the advantages of using a resonant reflector in conjunction with a DBR mirror stack, it has been found that the reflectivity of the resonant reflector can be limited if not properly isolated from the DBR mirror stack. FIG. 4 is a graph showing the reflectance versus wavelength of an all non-conductive (k=0) resonant reflector placed adjacent a top mirror that is also non-conductive (k=0). The reflectance curve has a narrow bandwidth, and reaches about 100% reflectivity at the resonant wavelength. In contrast, FIG. 5 shows the reflectance versus wavelength of an all non-conductive resonant reflector placed adjacent a top mirror that is slightly conductive (k=$10^{-5}$). As can be seen, having an adjacent top mirror that is slightly conductive significantly degrades the performance of the resonant reflector. Too much energy in the guided-mode in the waveguide overlaps into the lossy, conductive DBR films of the optoelectronic device.

To overcome this and other difficulties, the present invention contemplates isolating the resonant reflector from adjacent conducting layers. Isolation is preferably accomplished by providing a non-conductive (e.g. dielectric) buffer or cladding layer between the resonant reflector and the adjacent conducting layer of the optoelectronic device. The non-conductive cladding or buffer layer is preferably sufficiently thick, and/or has a sufficiently low refractive index relative to the refractive index of the waveguide of the resonant reflector, to substantially prevent energy in the evanescent tail of the guided mode in the waveguide from entering the adjacent conductive layer of the optoelectronic device. In a preferred embodiment, the waveguide is formed from a dielectric that has a higher refractive index than the refractive index of the buffer or cladding layer, and also higher than the average refractive index of the grating. The thickness of the waveguide preferably depends on the refractive index difference between the waveguide and the buffer or cladding layer.

Figure 6:
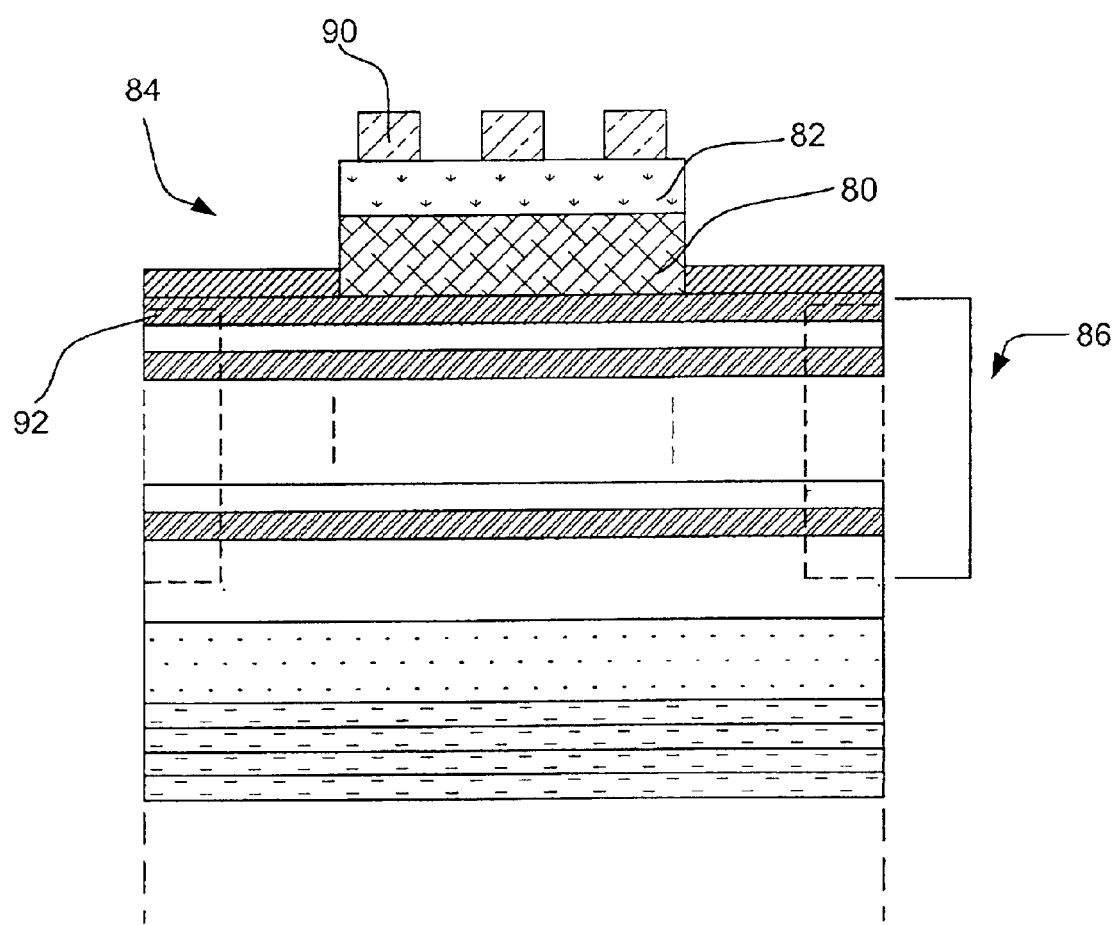
FIG. 6 is a schematic cross-sectional side view of a planar, current-guided, GaAs/AlGaAs top surface emitting vertical cavity laser with a cladding or buffer layer interposed between the waveguide layer of the resonant reflector and the top DBR mirror.

FIG. 6 is a schematic cross-sectional side view of a planar, current-guided, GaAs/AlGaAs top surface emitting vertical cavity laser with a cladding or buffer layer 80 interposed between the waveguide layer 82 of the resonant reflector 84 and the top DBR mirror 86. As indicated above, the cladding or buffer layer 80 is preferably sufficiently thick, and/or has a sufficiently low refractive index relative to the refractive index of the waveguide of the resonant reflector, to substantially prevent energy in the evanescent tail of the guided mode in the waveguide from entering an adjacent conductive layer of the optoelectronic device.

In the illustrative embodiment, the grating layer 90 is $SiO_2$ with an index of refraction of about 1.484 and a thickness of 0.340 µm. The waveguide layer 82 may be GaAs with an index of refraction of 3.523 and a thickness of 0.280 µm. Alternatively, the waveguide may be a ternary compound such as $Al_xGa_{1-x}As$, with x close to one, or a high refractive index dielectric such as TiO2, ZrO2, HfO2, or Si3N4. The thickness of the waveguide preferably depends on the refractive index difference between the waveguide and the buffer or cladding layer. The cladding or buffer layer 80 in the illustrative embodiment is AlO, with an index of refraction of 1.6 and a thickness of 0.766 µm. Finally, the top DBR mirror layer 92 may be AlGaAs with an index of refraction of 3.418 and a thickness of 0.072 µm. In this embodiment, the cladding or buffer layer 80 has an increased thickness and a reduced index of refraction relative to the embodiment shown in FIG. 2, both of which help prevent energy in the evanescent tail of the guided mode in the waveguide layer 82 from entering the top DBR mirror layer 92. It is contemplated however, that similar results may be achieved by either increasing the thickness or reducing the index of refraction of the cladding or buffer layer 80, if desired.

As indicated above, the cladding or buffer layer 80 may be AlO, which has a relatively low refractive index. In one method, this can be accomplished by initially forming the cladding or buffer layer 80 with AlGaAs, with a relatively high concentration of aluminum (e.g.>95%). AlGaAs has a relatively high index of refraction. Then, the waveguide layer 82 and grating layer 90 are provided. The cladding or buffer layer 80, waveguide layer 82 and grating 90 may then be removed around the periphery of the desired optical cavity. Contacts 93 may then be deposited on the exposed top mirror 86 to provide electrical contact to the top mirror. Then, the device may be subject to an oxidizing environment, which oxidizes the AlGaAs material of the cladding or buffer layer 80, resulting in AlO which has a relatively low refractive index. The AlGaAs material is preferably oxidized laterally in from the exposed edges of the cladding or buffer layer 80.

Figure 7:
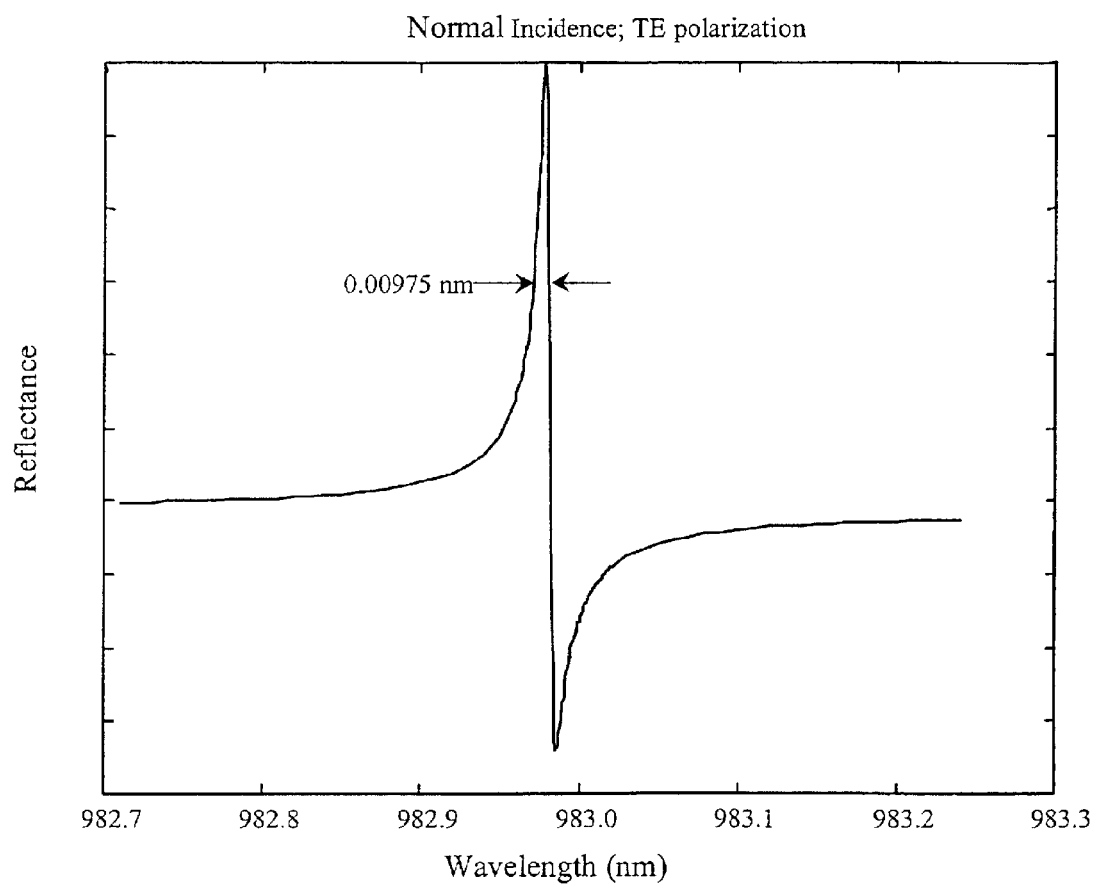
FIG. 7 is a graph showing the reflectance versus wavelength of the resonant reflector of FIG. 6 when the top layers of the top DBR mirror 86 are non-conductive (k=0)
Figure 8:
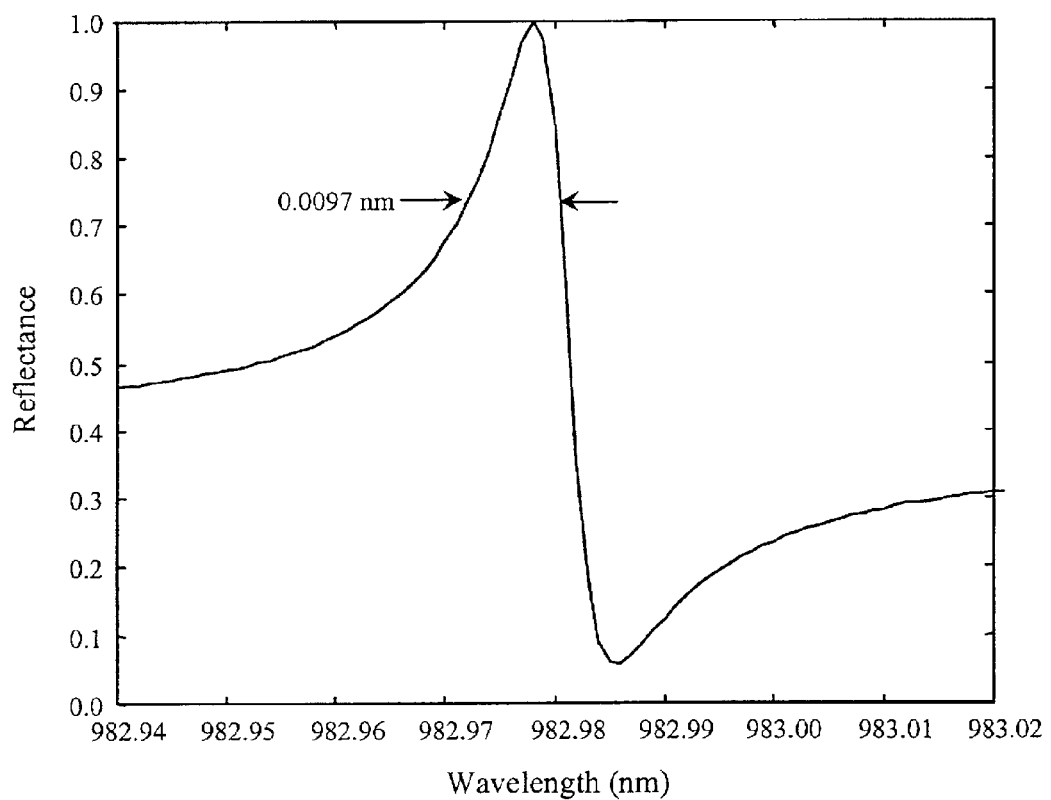
FIG. 8 is a graph showing the reflectance versus wavelength of the resonant reflector of FIG. 6 when the top layers of the top DBR mirror 86 are slightly conductive ($k=10^{-5}$)

FIG. 7 is a graph showing the reflectance versus wavelength of the resonant reflector of FIG. 6 when the top layers of the top DBR mirror 86 are non-conductive (k=0). The reflectance curve has a narrow bandwidth (0.00975 nm), and theoretically reaches 100% reflectivity at the resonant wavelength. FIG. 8 is a graph showing the reflectance versus wavelength of the resonant reflector of FIG. 6 when the top layers of the top DBR mirror 86 are slightly conductive ($k=10^{-5}$). As can be seen, the reflectance curve still has a narrow bandwidth (0.0097 nm), and theoretically reaches 100% reflectivity at the resonant wavelength. Therefore, and unlike FIG. 5, there is little or no degradation in the observed reflectance of the resonant reflector, even when placed adjacent a conductive layer.

Figure 9:
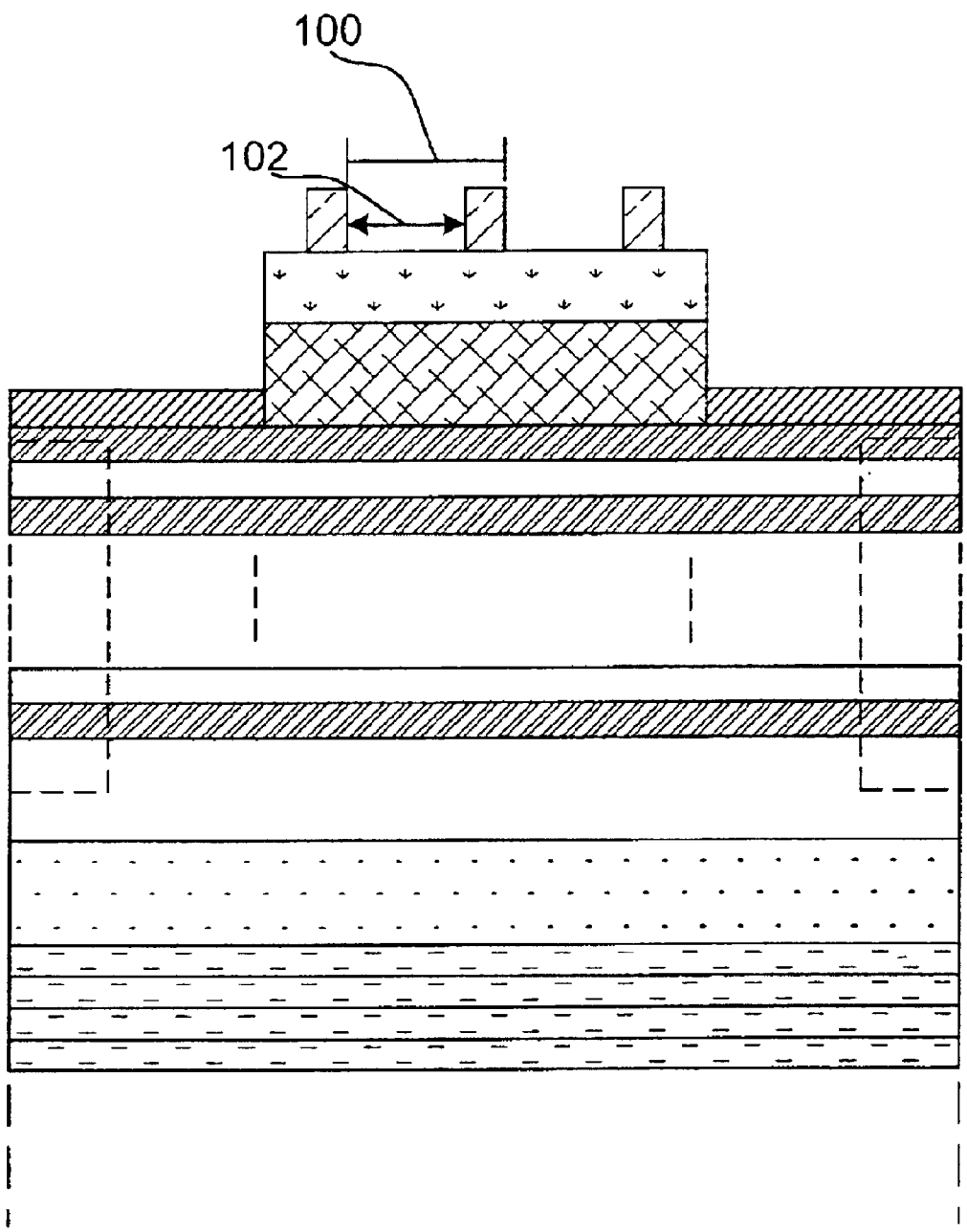
FIG. 9 is a schematic cross-sectional side view of a top surface emitting vertical cavity laser similar to that shown in FIG. 6, but with a modified grating fill factor.

FIG. 9 is a schematic cross-sectional side view of a top surface emitting vertical cavity laser similar to that shown in FIG. 6, but with a modified grating fill factor. The grating fill factor is defined as the grating spacing 102 divided by the grating period 100. The resonant wavelength of a resonant reflector is often determined by the grating period 100, and the spectral bandwidth is often determined by the modulation of the refractive index and fill factor of the grating.

When the grating is formed from an oxide such as $SiO_2$, the modulation of the refractive index is related to the difference between the dielectric constants of the grating material and the material that fills the spaces between the grating elements, divided by the average dielectric constant across the grating. The average dielectric constant across the grating can be changed by varying the fill factor of the grating. For example, and assuming a constant grating period, the grating fill factor can be increased by reducing the width of each grating element. A limitation of achieving a desired spectral bandwidth of a resonant reflector by altering the grating fill factor is that the design rules of many manufacturing processes limit the minimum width of the grating elements. Thus, to achieve some spectral bandwidths, the design rules may have to be pushed, which may reduce the manufacturing yield for the devices.

Figure 10:
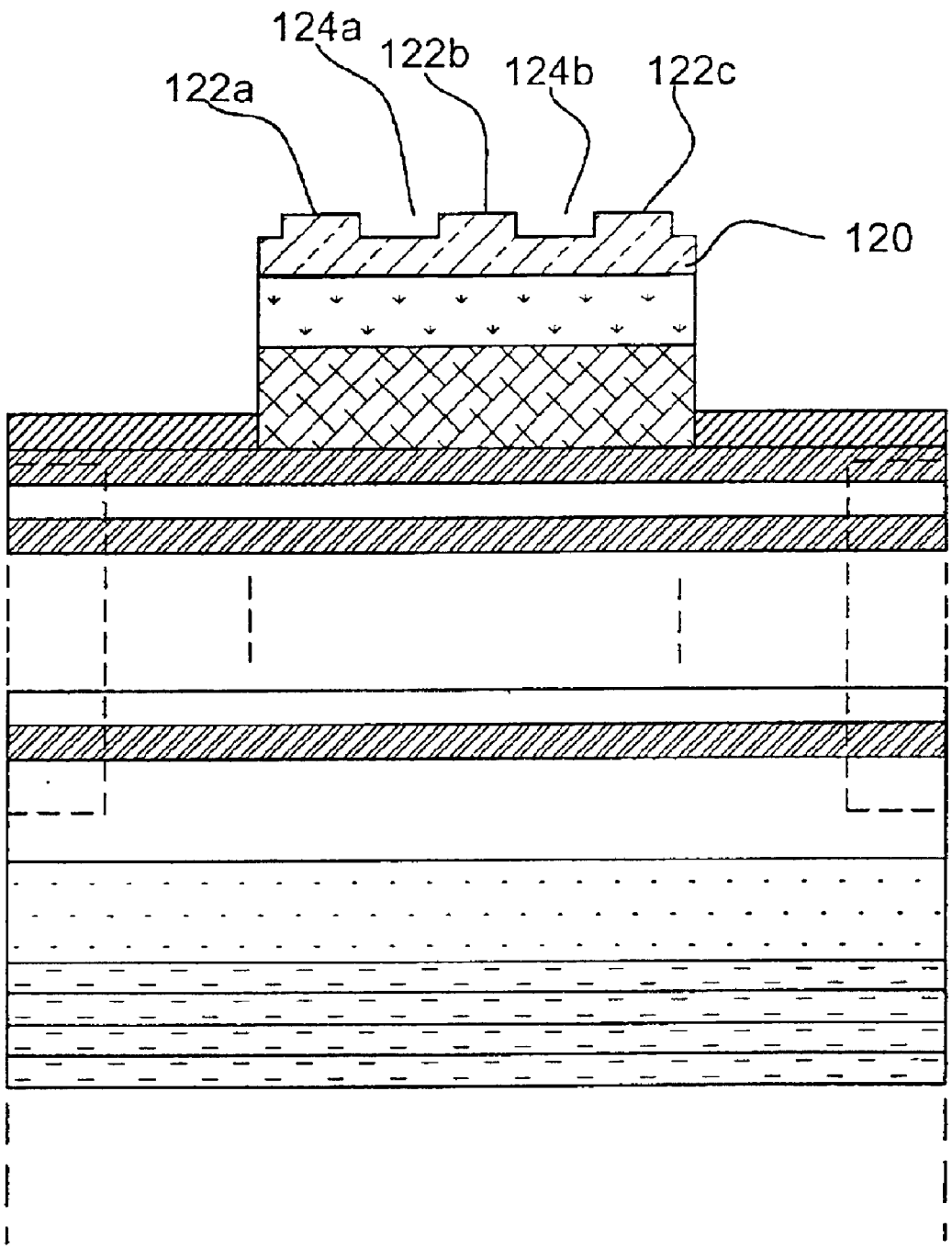
FIG. 10 is a schematic cross-sectional side view of a top surface emitting vertical cavity laser similar to that shown in FIG. 6, but with a grating film that has a controlled etch depth.

FIG. 10 is a schematic cross-sectional side view of a top surface emitting vertical cavity laser similar to that shown in FIG. 6, but with a grating film that has a controlled etch depth to control the spectral bandwidth of the resonant reflector. Like above, a grating film 120 is provided and subsequently etched to form two or more spaced grating regions 122a–122c separated by one or more spaced etched regions 124a–124b. However, rather than etching all the way through the grating film 120 to achieve a desired grating fill factor, and thus a desired spectral bandwidth, the depth of the etch is controlled. By controlling the depth of the etch, a desired average dielectric constant across the grating can be achieved. A benefit of this approach is that the grating width and grating spacing may be optimized to the design rules of the manufacturing process, and the etch depth can be controlled to achieve the desired spectral bandwidth. For example, a fill factor of about 50% is preferred. This may increase the producibility and yield of the resonant reflector.

Figure 11:
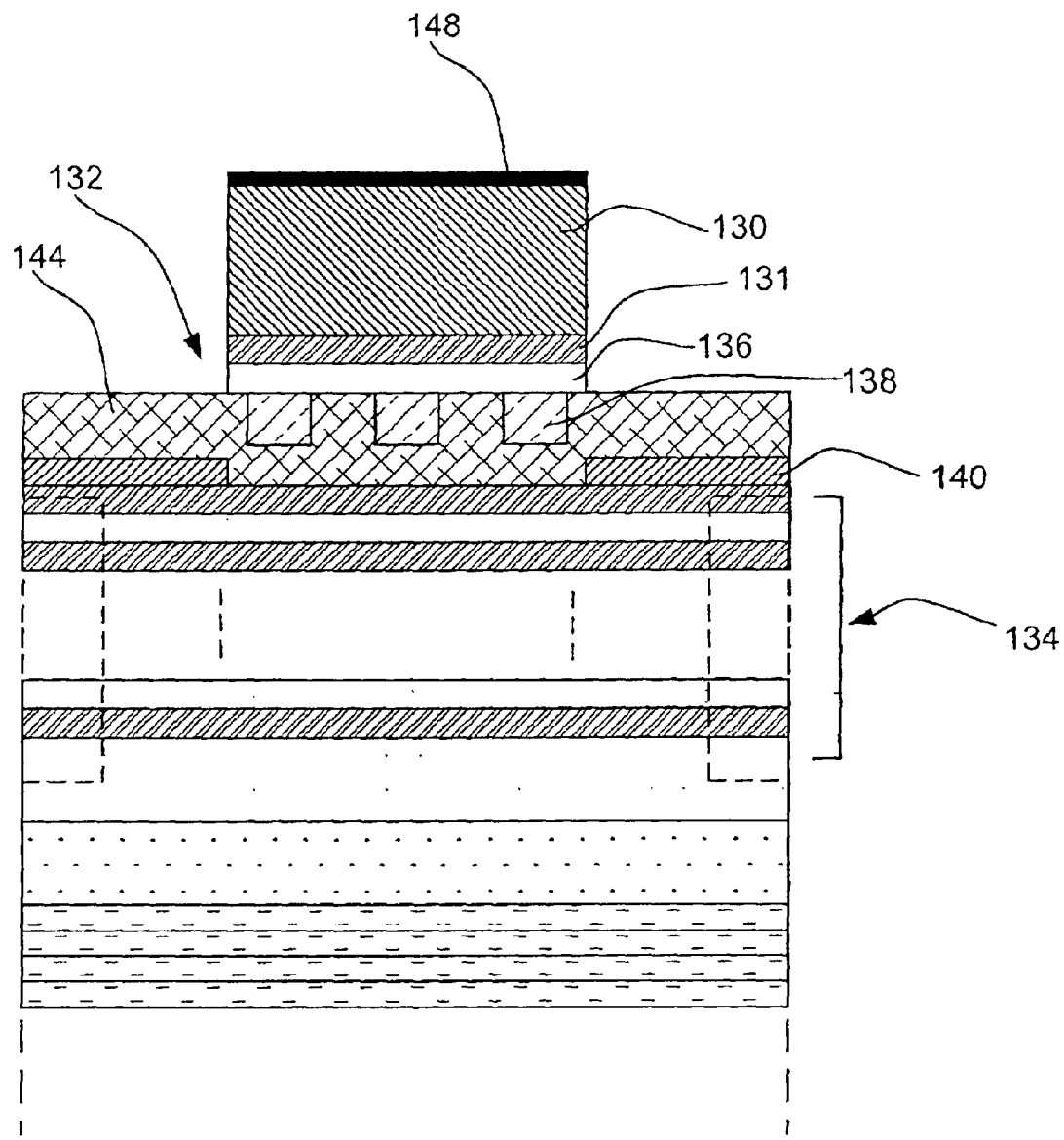
FIG. 11 is a schematic cross-sectional side view of a vertical cavity surface emitting laser that is formed by bonding a resonant reflector that was prepared on a first substrate to the top mirror of the vertical cavity surface emitting laser that was prepared on a second substrate.

FIG. 11 is a schematic cross-sectional side view of a vertical cavity surface emitting laser that is formed by bonding a resonant reflector 132 that is prepared on a first substrate 130 to a top mirror 134 of a vertical cavity surface emitting laser that is prepared on a second substrate. In accordance with this embodiment, a resonant reflector is formed on a front side 131 of a first substrate 130. This includes forming at least a waveguide 136 and a grating 138, as shown. Then, at least a portion of an optoelectronic device, such as a vertical cavity surface emitting laser or resonant cavity photodetector, is prepared on a front side of a second substrate. In FIG. 11, this includes a bottom DBR mirror, an active region, a top DBR mirror 134, and one or more contacts 140.

Thereafter, the front side of the first substrate 130 is bonded to the front side of the second substrate to complete the optoelectronic device. The first substrate 130 may be bonded to the second substrate using an optical epoxy 144, and preferably a non-conductive optical epoxy. The optical epoxy is preferably sufficiently thick, or has a sufficiently low refractive index relative to the refractive index of the waveguide 136 of the resonant reflector 132, so that the energy from the evanescent wave vector in the waveguide 136 is substantially prevented from entering the optoelectronic device on the first substrate. A anti-reflective coating 148 may be applied to the backside of the first substrate 130 as shown.

It is recognized that the relative position of the waveguide 136 and grating 138 may be changed. For example, and as shown in FIG. 11, the grating may be positioned more toward the front side of the first substrate than the waveguide. Alternatively, however, the waveguide may be positioned more toward the front side of the first substrate than the grating, if desired.

Figure 12:
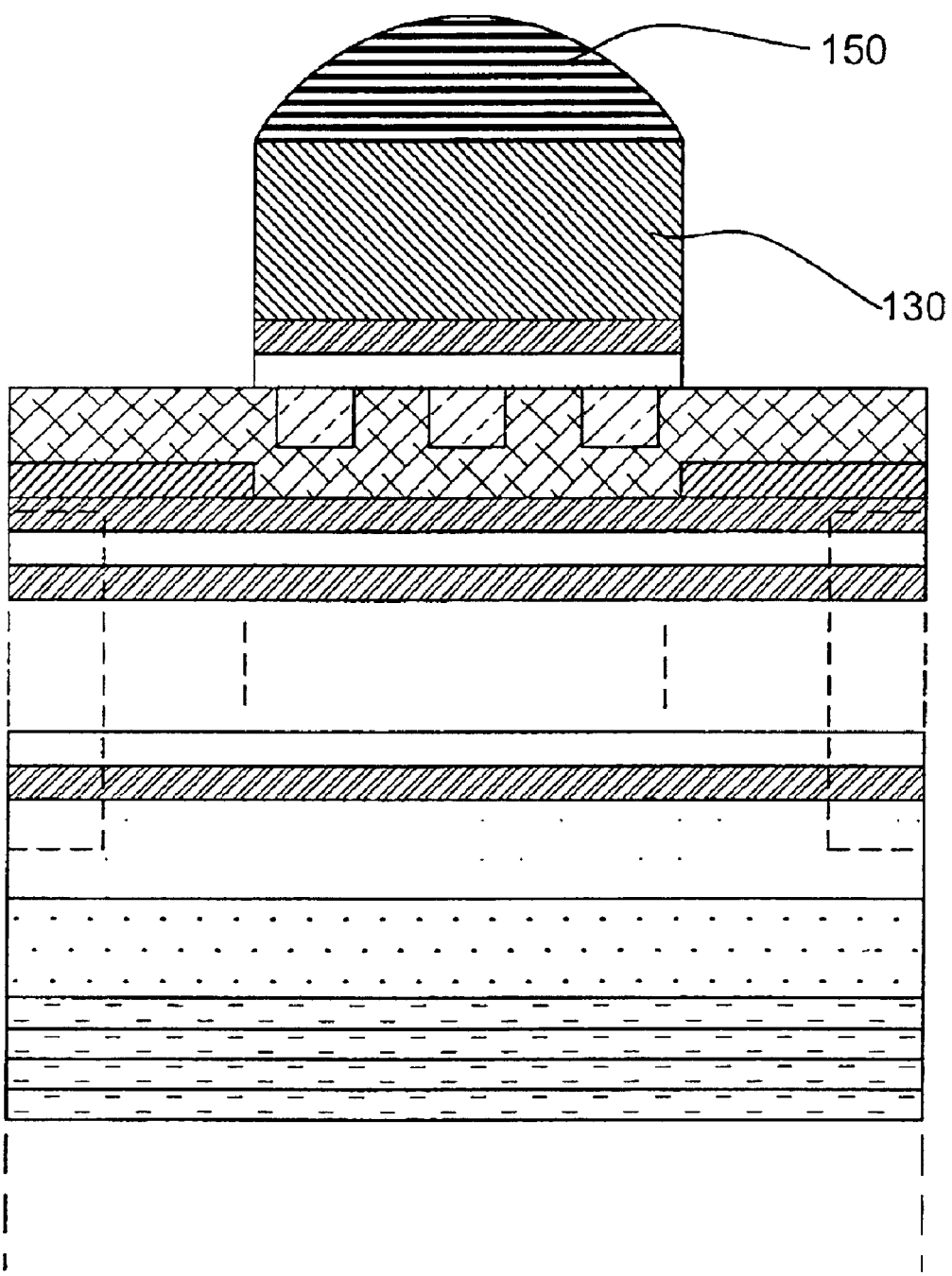
FIG. 12 is a schematic cross-sectional side view of the vertical cavity surface emitting laser of FIG. 11 with a microlens positioned on the backside of the substrate that has the resonant reflector formed thereon.

FIG. 12 is a schematic cross-sectional side view of the vertical cavity surface-emitting laser of FIG. 11 with a microlens 150 positioned on the backside of the first substrate 130. For top emitting devices, a microlens such as a collimating microlens may be formed on the backside of the first substrate 130. For back emitting devices, a collimating microlens may be formed on the backside of the substrate that carries the bottom mirror, the active region and the top mirror of the optoelectronic device. In either case, the collimating microlens 150 is preferably placed in registration with the output of the optoelectronic device as shown.

Figure 13:
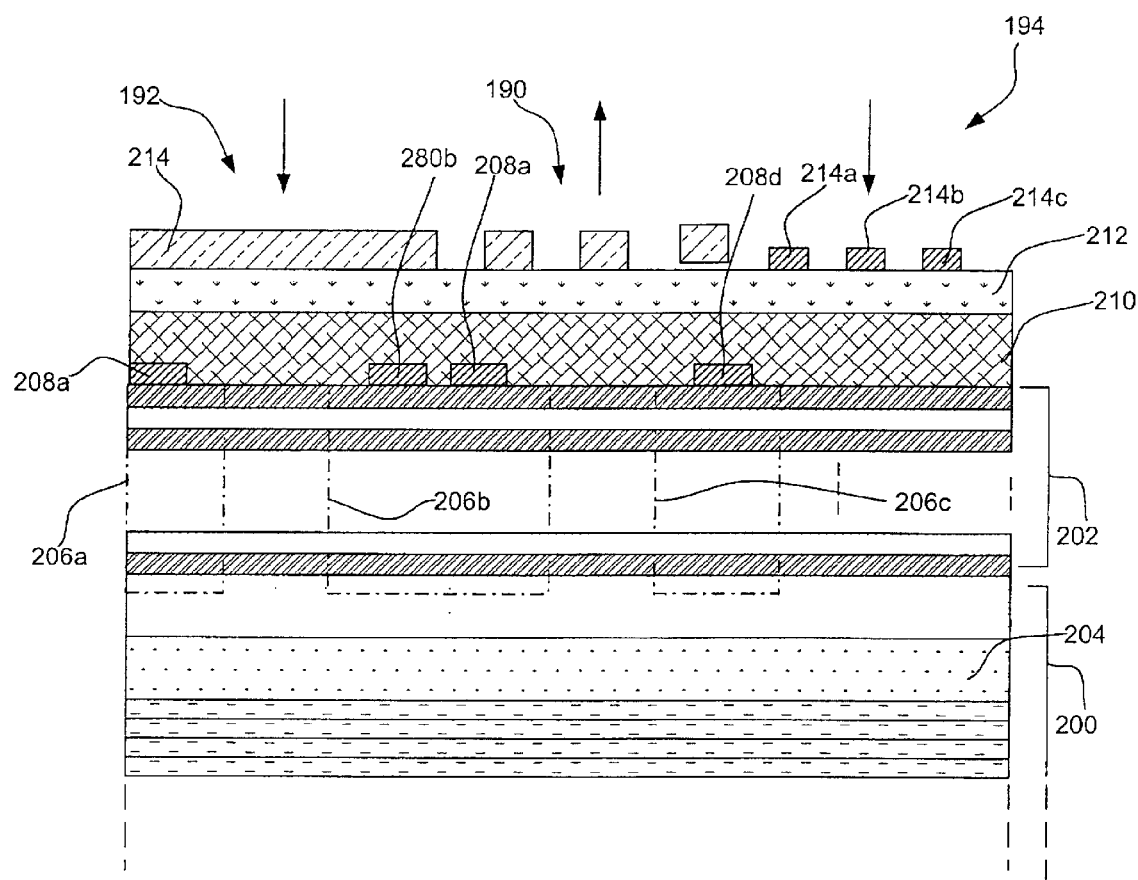
FIG. 13 is a schematic cross-sectional side view of an illustrative monolithic substrate having a RCPD, a VCSEL and a MSM.

It is contemplated that a number of optoelectronic devices may be formed on a common substrate, as shown in FIG. 13. One application for such a configuration is a monolithic transceiver that includes one or more light emitting devices 190 and one or more light receiving devices 192 and 194. In this illustrative embodiment, both the light emitting and light receiving devices are formed on a common substrate (not shown). In one example, a bottom mirror is first formed on the common substrate. The bottom mirror may serve as the bottom mirror for more than one of the optoelectronic devices 190, 192 and 194, and is preferably a DBR mirror stack that is doped to be at least partially conductive. An active region 200 is then formed on the bottom mirror, followed by a top mirror 202. Like the bottom mirror, the top mirror 202 is preferably a DBR mirror stack, and is doped to be the opposite conductivity type of the bottom mirror. The active region 200 may include cladding layers 204 on either side of the active region 200 to help focus the light energy and current in the active region.

A deep H+ ion implant, as shown at 206a–206c, may provide gain guide apertures for selected optoelectronic devices, and may further electrically isolate adjacent devices from one another. While a deep H+ implant is provided as an illustration, it is contemplated that any type of current and field confinement may be used, including for example, gain-guided, oxide-confinement, or any other means. Contacts 208a–208d may be provided on the top mirror 202 and on the bottom surface of the common substrate to provide electrical contact to each of the optoelectronic devices.

Next, a cladding or buffer layer 210 may be provided above the top mirror 202. A resonant reflector may then be provided on top of the cladding or buffer layer 210. The resonant reflector may include a waveguide 212 and a grating film 214. For some optoelectronic devices, such as top emitting devices 190, the grating film 214 may be etched to form a grating, as shown. The grating may substantially increase the reflectivity of the resonant reflector in those regions. For other optoelectronic devices, such as top receiving devices 192, the grating film may either include a different grating structure (e.g., wider spectral bandwidth), or remain non-etched as shown. This may reduce the reflectivity of the resonant reflector, thereby allowing light to more easily enter the optical cavity. For yet other optoelectronic devices, such as Metal-Semiconductor-Metal (MSM) receiving devices 194, the grating film may be removed altogether, and a metal grid 214a–214c may be formed on the waveguide layer 212 or cladding or buffer layer 210, as desired.

To isolate the resonant reflector from the optoelectronic devices, and in particular the conductive top mirror 202, the cladding or buffer layer 210 may be sufficiently thick to substantially prevent energy in the evanescent tail of the guided mode in the waveguide 212 from entering the top mirror 202. Alternatively, or in addition, the cladding or buffer layer 210 may be formed from a material that has a sufficiently low refractive index relative to the refractive index of the waveguide 212 to substantially prevent energy in the evanescent tail of the guided mode in the waveguide 212 from entering the top mirror 202.

Implementation of the described resonant reflector optoelectronic structures will permit polarization, emission wavelength and mode control. These structures and properties can be designed and fabricated using techniques such as lithography or holography, and may not be subject to growth thickness variations alone. The above techniques can be applied to produce, for example, VCSELs with high power single-mode/polarization emission from apertures exceeding a few microns in diameter. Furthermore, wavelength and/or polarization variation across a chip, array or wafer can be used for spatially varied wavelength/polarization division multiplexing, multi-wavelength spectroscopy, etc.

Having thus described the preferred embodiments of the present invention, those of skill in the art will readily appreciate that the teachings found herein may be applied to yet other embodiments within the scope of the claims hereto attached.

What is claimed is:

1. An optoelectronic device having a top mirror and a bottom mirror, the top mirror and bottom mirror being at least partially conductive, the improvement comprising:
    a resonant reflector positioned adjacent a selected one of the top or bottom mirrors, the resonant reflector having a waveguide and a grating configured such that a first-diffraction order wave vector of the grating substantially matches a propagating mode of the waveguide; and
    a cladding or buffer layer positioned between the resonant reflector and the selected top or bottom mirror, the cladding or buffer layer being sufficiently thick, and/or having a sufficiently low refractive index relative to the refractive index of the waveguide, to substantially prevent energy in the evanescent tail of the guided mode in the waveguide from entering the selected top or bottom mirror.

2. An optoelectronic device according to claim 1, wherein cladding or buffer layer is non-conductive.

3. An optoelectronic device according to claim 1, wherein the cladding or buffer layer and the waveguide each have a refractive index, the refractive index of the cladding or buffer layer being substantially less than the refractive index of the waveguide.

4. An optoelectronic device according to claim 3, wherein the selected top or bottom mirror includes an adjacent layer that is positioned adjacent the cladding or buffer layer, the refractive index of the cladding or buffer layer being less than the refractive index of the adjacent layer.

5. An optoelectronic device according to claim 4, wherein the thickness of the cladding or buffer layer is thicker than the adjacent layer.

6. An optoelectronic device according to claim 5, wherein the thickness of the cladding or buffer layer depends on the refractive index difference between the cladding or buffer layer and the waveguide.

7. An optoelectronic device according to claim 2, wherein the cladding or buffer layer is a dielectric film.

8. An optoelectronic device according to claim 7, wherein the cladding or buffer layer is an aluminum oxide film.

9. An optoelectronic device according to claim 7, wherein the waveguide region includes AlGaAs.

10. An optoelectronic device according to claim 7, wherein the waveguide region includes a high refractive index dielectric.

11. An optoelectronic device according to claim 7, wherein the grating is a dielectric film.

12. An optoelectronic device according to claim 7, wherein the grating is a silicon oxide film.

13. An optoelectronic device according to claim 7, wherein the cladding or buffer layer functions as part of the resonant reflector.

14. A Vertical Cavity Surface Emitting Laser (VCSEL) or Resonant Cavity Photo Detector (RCPD), comprising:
   a top mirror and a bottom mirror, with an active region therebetween;
   a resonant reflector positioned adjacent at least one of the top mirror and/or bottom mirror, the resonant reflector including;
   a waveguide; and
   a grating film having two or more spaced grating regions separated by one or more spaced regions, the spaced regions of the grating film having a grating film thickness that is less than the grating film thickness of the grating regions, but greater than zero.

15. A resonant reflector according to claim 14, wherein selected optical properties of the resonant reflector are controlled by the grating film thickness of the spaced regions and grating regions.

16. A resonant reflector according to claim 15, wherein the spectral bandwidth of the resonant reflector is determined by the grating film thickness of the spaced regions and grating regions.

17. A resonant reflector according to claim 15, wherein each grating region has a lateral width, with the grating regions collectively having a grating period, the grating period minus the grating width defining a grating spacing between adjacent grating regions, the grating spacing divided by the grating period defining a grating fill factor, the grating fill factor being about 50%.

18. A monolithic transceiver having a light emitting device and a light receiving device, comprising:
   providing a bottom mirror on a substrate, the bottom mirror being at least partially conductive;
   providing an active region on the bottom mirror;
   providing a top mirror on the active region, the top mirror being at least partially conductive;
   providing a cladding or buffer layer on the top mirror, the cladding or buffer layer being non-conductive;
   providing a waveguide on the cladding or buffer layer;
   providing a grating layer above the waveguide, the waveguide and grating being configured such that a first-diffraction order wave vector of the grating substantially matches a propagating mode of the waveguide;
   the cladding or buffer layer being sufficiently thick, or having a sufficiently low refractive index relative to the refractive index of the waveguide, such that energy in the evanescent tail of the guided mode in the waveguide is substantially prevented from entering the top mirror; and
   the grating layer having a first etched grating structure above the light emitting device.

19. A monolithic transceiver according to claim 18, further comprising a second etched grating structure above the light receiving device.

20. A monolithic transceiver according to claim 18, wherein the grating layer does not have an etched grating structure above the light receiving device.

21. A monolithic transceiver according to claim 18, wherein the grating layer is removed above the light receiving device.

22. A device comprising:
   a first substrate having a front side and a back side with at least part of an optoelectronic device formed on the front side;
   a second substrate having a front side and a back side with a resonant reflector formed on the front side; and
   the front side of the first substrate bonded to the front side of the second substrate; and
   wherein the resonant reflector includes a waveguide and a grating.

23. A device according to claim 22, wherein the grating is positioned more toward the front side of the second substrate than is the waveguide.

24. A device according to claim 22, wherein the waveguide is positioned more toward the front side of the second substrate than is the grating.

25. A device comprising:
   a first substrate having a front side and a back side with at least part of an optoelectronic device formed on the front side;
   a second substrate having a front side and a back side with a resonant reflector formed on the front side; and
   the front side of the first substrate bonded to the front side of the second substrate; and
   wherein the front side of the first substrate is bonded to the front side of the second substrate via an optical epoxy.

26. A device according to claim 25, wherein the optical epoxy is non-conductive.

27. A device according to claim 26, wherein the waveguide and grating are configured such that a first-diffraction order wave vector of the grating substantially matches a propagating mode of the waveguide.

28. A device according to claim 27, wherein the optical epoxy is sufficiently thick, or has a sufficiently low refractive index relative to the refractive index of the waveguide, to substantially prevent energy in the evanescent tail of the guided mode in the waveguide from entering the first substrate.

29. A device comprising:
   a first substrate having a front side and a back side with at least part of an optoelectronic device formed on the front side;
   a second substrate having a front side and a back side with a resonant reflector formed on the front side;
   the front side of the first substrate bonded to the front side of the second substrate; and
   a collimating microlens positioned on the back side of the second substrate.

30. A device according to claim 29, wherein the collimating microlens is in registration with the resonant reflector and the optoelectronic device.

31. A device comprising:
   a first substrate having a front side and a back side with at least part of an optoelectronic device formed on the front side;
   a second substrate having a front side and a back side with a resonant reflector formed on the front side; and
   the front side of the first substrate bonded to the first side of the second substrate; and
   wherein the resonant reflector includes a grating.

32. A device comprising:
a first substrate having a front side and a back side with at least part of an optoelectronic device formed on the front side;
a second substrate having a front side and a back side with a resonant reflector formed on the front side; and
the front side of the first substrate bonded to the front side of the second substrate; and
wherein the resonant reflector includes a waveguide.

* * * * *